(12) United States Patent
Braghiroli

(10) Patent No.: US 11,721,526 B2
(45) Date of Patent: Aug. 8, 2023

(54) SYSTEM AND METHOD OF POWER GENERATION WITH PHASE LINKED SOLID-STATE GENERATOR MODULES

(71) Applicant: MKS Instruments, Inc., Andover, MA (US)

(72) Inventor: Francesco Braghiroli, Reggio Emilia (IT)

(73) Assignee: MKS Instruments, Inc., Andover, MA (US)

(*) Notice: Subject to any disclaimer, the term of this patent is extended or adjusted under 35 U.S.C. 154(b) by 344 days.

(21) Appl. No.: 16/881,458

(22) Filed: May 22, 2020

(65) Prior Publication Data

US 2020/0381218 A1 Dec. 3, 2020

Related U.S. Application Data

(60) Provisional application No. 62/855,136, filed on May 31, 2019.

(51) Int. Cl.
*H01J 37/32* (2006.01)
*H05H 1/46* (2006.01)
*H03L 7/099* (2006.01)

(52) U.S. Cl.
CPC ... *H01J 37/32311* (2013.01); *H01J 37/32201* (2013.01); *H01J 37/32293* (2013.01); *H01J 37/32798* (2013.01); *H03L 7/099* (2013.01); *H05H 1/46* (2013.01); *H01J 2237/24564* (2013.01); *H01J 2237/24592* (2013.01)

(58) Field of Classification Search
None
See application file for complete search history.

(56) References Cited

U.S. PATENT DOCUMENTS

| 6,214,162 | B1 | 4/2001 | Koshimizu |
| 2009/0159214 | A1 | 6/2009 | Kasai |
| 2010/0276391 | A1* | 11/2010 | Grimbergen ...... H01J 37/32174 216/41 |
| 2013/0284369 | A1 | 10/2013 | Kobayashi |
| 2014/0265910 | A1 | 9/2014 | Kobayashi et al. |
| 2018/0082821 | A1 | 3/2018 | Ikeda et al. |
| 2018/0330909 | A1 | 11/2018 | Boswell et al. |
| 2019/0080886 | A1* | 3/2019 | Kaplan .................... H03F 3/19 |

FOREIGN PATENT DOCUMENTS

| CN | 108573848 A | | 9/2018 |
| KR | 1020130071292 A | * | 6/2013 |
| KR | 1020130071292 A | | 6/2013 |
| KR | 1020180119221 A | | 11/2018 |

(Continued)

OTHER PUBLICATIONS

International Search Report and Written Opinion for PCT/US2020/035220 dated Sep. 18, 2020.

*Primary Examiner* — Dedei K Hammond
(74) *Attorney, Agent, or Firm* — Burns & Levinson LLP; Joseph M. Maraia; Steven M. Mills

(57) ABSTRACT

A method of generating power with a power generation system. Solid state generators generate a plurality of outputs. The outputs of the solid state generator modules are combined from a plurality of channels, in a combiner, using a phase optimization technique to generate an in phase combined output power.

19 Claims, 13 Drawing Sheets

(56) References Cited

FOREIGN PATENT DOCUMENTS

| TW | 201705186 | A | | 2/2017 | | |
|---|---|---|---|---|---|---|
| TW | I749083 | B | * | 10/2017 | | |
| TW | 201810419 | A | * | 3/2018 | ........ | H01J 37/32055 |
| TW | 201826313 | A | | 7/2018 | | |
| TW | 201907440 | A | | 2/2019 | | |

* cited by examiner

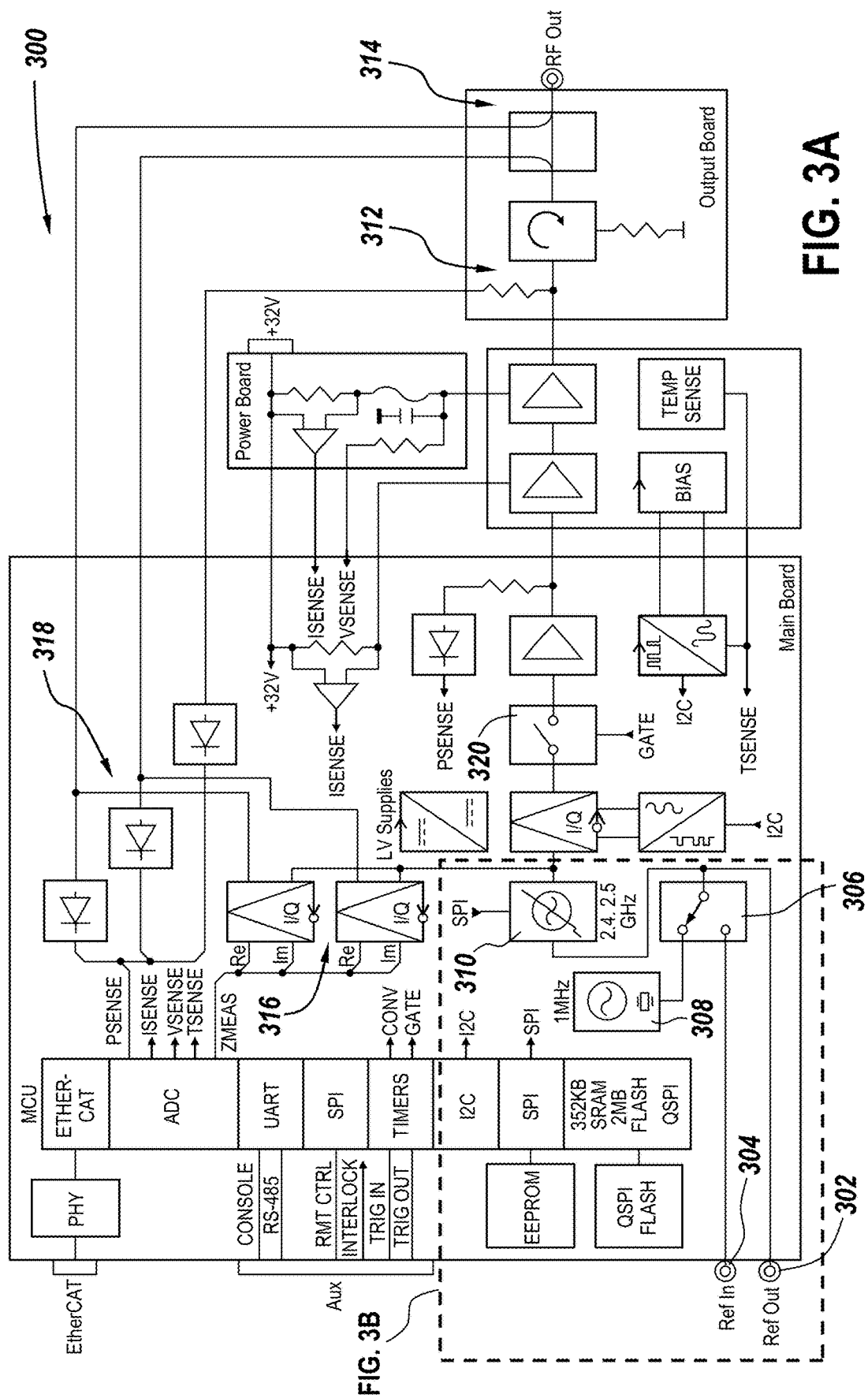

SYSTEM AND METHOD OF POWER GENERATION WITH PHASE LINKED SOLID-STATE GENERATOR MODULES

CROSS REFERENCE TO RELATED APPLICATIONS

This application claims priority to and the benefit of U.S. Provisional Patent Application No. 62/855,136, filed on May 31, 2019 and titled "PHASE LINKING OF MULTIPLE SOLID-STATE GENERATOR MODULES AND SMART PALLETS FOR PLASMA GENERATOR", the contents of which are incorporated herein by reference as though fully set forth herein.

FIELD OF THE TECHNOLOGY

The subject disclosure relates to semiconductor processing, and more particularly to systems and methods for generating RF or microwave power.

BACKGROUND OF TECHNOLOGY

Existing solid-state microwave power generators normally combine a number of medium power sources to achieve a required total output power. Since combined power is the vector sum of single sources, amplitude and phase imbalances between channels result in power losses. Whilst amplitude differences are often corrected, in state-of-the-art solid-state generators phase shifts are not corrected for. The market request of higher power and efficiency units (e.g. CVD synthetic diamond growing) is posing the serious threat of effectively minimize phase-related losses.

Power generation can be used in a wide array of applications, from drying to plasma generation during semiconductor processing. In conventional approaches of creating plasma in a process chamber for either semiconductor wafer processing such as strip, etch, deposition or high-end industrial plasma processing such as Plasma Assisted Physical Vapor Deposition or PAPCVD for coating of industrial tools and hardware, a single entry of RF or microwave input is utilized. This single entry causes non-uniform plasma formation both in terms of intensity and density. In some systems, to alleviate this shortcoming to some degree, a shower head can be used to distribute the plasma. However, the shower head cannot provide an ideal plasma formation in the processing chamber or cavity. Some known system within semiconductor industry employ several different RF generators to manipulate plasma, using highly bulky magnetic confinement. A disadvantage of doing so is that each RF generator has an oscillator and is set to its own phase, creating inefficiencies, localized heating, and less resonant oscillation.

Further, impedance tuning is typically done by measuring the amount of reflected power at a given area and changing the signal frequency to maximize the amount of absorbed forward power. The disadvantage of this is that it takes time to look for the signal to sweep from a minimum to maximum value and choose the lowest reflected power. Therefore this method cannot effectively be performed in real time under dynamic conditions.

Further, deterioration of the processing chamber or the like (e.g. plasma tube or processing cavity) remains a concern in plasma generation systems and processes. As the plasma tube, processing chamber or processing cavity are repeatedly and/or continuously exposed to the harsh plasma environment, the surface condition of the plasma tube, processing chamber and/or processing cavity deteriorate due to interaction of the surface with the plasma. Usually, the interaction or deterioration occurs in the form of an etch process. The process occurs most prevalently when the surface material, which can be, for example, metal or dielectric such as Quartz, Sapphire, Ceramic, other dielectric, is exposed to fluorinated plasma chemistries such as $NF_3$ or $CF_4$ or Chlorine-based chemistries.

SUMMARY OF THE TECHNOLOGY

In light of the needs described above, in at least one aspect, the subject technology relates to a system and method of generating a uniform plasma with improved throughput and better yield. In some cases, the subject technology phase links a number of RF/microwave modules together before combining power within a processing chamber. Impedance is measured within the processing chamber to derive performance characteristics of the processing chamber. Impedance of individual RF generators is determined, and by knowing the impedance of the individual generators (and therefore the phase, magnitude, and frequency), the plasma within the processing chamber is manipulated and tuned to minimize reflected power and/or induce a uniform plasma in the chamber for improved process performance on a semiconductor substrate. The measured impedance can also be relied upon to identify unknown process gasses and monitor the life span of the processing chamber. The described system and method can also determine an optimum phase shift between combined power sources to maximize output power and efficiency.

In at least one aspect, the subject technology relates to a plasma generation system having a reference clock, a plurality of solid state generator modules, and a processing chamber. The reference clock is configured to generate a reference signal. Each solid state generator module is linked to an electronic switch and each electronic switch is linked to the reference clock. Each solid state generator module is configured to generate an output based on the reference signal from the reference clock. The processing chamber is configured to receive the output of at least two of the solid state generator modules to combine the outputs of said solid state generator modules therein.

In some embodiments, the plasma generation system includes an I/Q modulator configured to demodulate a signal at an input to the processing chamber into an I/Q signal. The plasma generation system can then be further configured to: determine a voltage standing wave ratio (VSWR) and a reflection coefficient of the I/Q signal; calculate a first impedance of one of the solid state generator modules based on the VSWR and the reflection coefficient; and calculate a second impedance of a combined output power of the solid state generator modules within the processing chamber based on the first impedance. In some embodiments, the plasma generation system is further configured to adjust phase, magnitude, and frequency of at least one of the solid state generator modules based on the second impedance.

The plasma generation system can be configured to monitor a change in impedance of the processing chamber over time. In some embodiments, the plasma generation system is configured to determine a remaining life of the processing chamber based on the change in impedance of the processing chamber over time. The plasma generation system can be configured to issue a warning based on the remaining life of the processing chamber. The plasma generation system can include a data bank storing impedance values of a plurality of gases, and the system can be configured to identify a process gas within the processing chamber, using the data bank, based on the change in impedance of the processing chamber over time.

In some embodiments the solid state generator modules are connected in a phase lock loop (PLL) such that the outputs of the solid state generator modules have a shared phase. In some cases, each solid state generator module includes a PLL reference input connected to the electronic switch and a PLL reference output connected to the electronic switch and a synthesizer, the synthesizer being connected to a second electronic switch to pulse modulate the output of the solid state generator module.

In at least one aspect, the subject technology relates to a method of generating power with a power generation system. A plurality of outputs are generated with a plurality of solid state generator modules. The outputs of the solid state generator modules are combined, in a combiner, from a plurality of channels using a phase optimization technique to generate an in phase combined output power.

In some embodiments, the phase optimization technique includes determining a phase shift for at least one of the channels and phase shifting the at least one channel. In some cases, the plurality of channels comprises three channels. The phase optimization technique can then include turning on the channels. A first channel, a second channel, and a third channel are determined. The second channel is phase shifted based on a sum of the first channel and the third channel to create an optimized second channel. The third channel is phase shifted based on a sum of the first channel and the optimized second channel. In some embodiments, the method includes at least one additional channel and the phase optimization technique includes, for each additional channel, phase shifting said additional channel to create an optimized additional channel based on a sum of all other channels, including any optimized channels. In some cases, the steps of phase shifting the second channel, phase shifting the third channel, and phase shifting additional channels are repeated a plurality of times.

In some embodiments, the phase optimization technique includes determining a phase shift for at least one of the channels using an algorithm, the algorithm comprising at least one of the following: a bisection method; a Goertzel-Reinsch algorithm; or a Discrete Fourier Transform. In some embodiments, the plurality of channels comprises three channels and the phase optimization technique includes: determining a first channel, a second channel, and a third channel; turning on the first channel and the second channel; phase shifting the second channel to match an output of the first channel; turning off the second channel and turning on the third channel; and phase shifting the third channel to match the output of the first channel.

In some embodiments, the method includes at least one additional channel and the phase optimization technique includes, for each additional channel, turning on the first channel and said additional channel, all other channels being turned off, and phase shifting said additional channel to match the output of the first channel.

In some embodiments, the method includes providing the in phase combined output power to a waveguide output. In some embodiments, the solid state generator modules are connected in a phase lock loop (PLL) such that the outputs of the solid state generator modules have a shared phase.

In at least one aspect, the subject technology relates to a power generation system having a plurality of solid state generator modules configured to generate a plurality of outputs and a combiner. The combiner is configured to combine the outputs of the solid state generator modules from a plurality of channels using a phase optimization technique to generate an in phase combined output power.

BRIEF DESCRIPTION OF THE DRAWINGS

So that those having ordinary skill in the art to which the disclosed system pertains will more readily understand how to make and use the same, reference may be had to the following drawings.

FIG. 3A is a block diagram of a circuit configuration of an exemplary RF generator in accordance with the subject technology.

DETAILED DESCRIPTION

Figure 1:
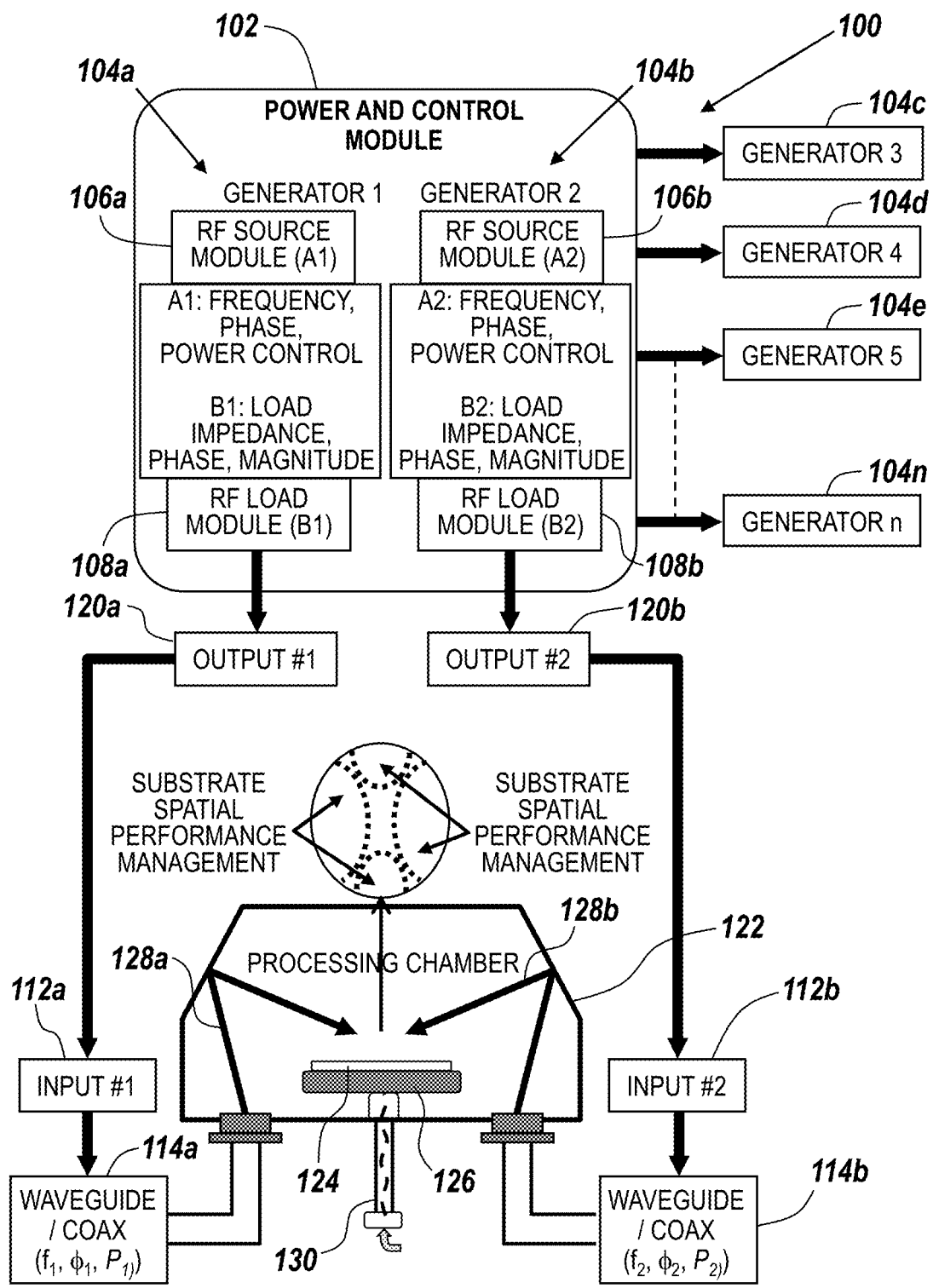
FIG. 1 is a schematic block diagram of a plasma generation system in accordance with the subject technology.

The subject technology overcomes many of the prior art problems associated with power generator systems and methods. In brief summary, the subject technology provides a system and method which combines power from a number of phase locked RF or microwave power modules. The advantages, and other features of the systems and methods disclosed herein, will become more readily apparent to those having ordinary skill in the art from the following detailed description of certain preferred embodiments taken in conjunction with the drawings which set forth representative embodiments of the present invention. Like reference numerals are used herein to denote like parts. Further, words denoting orientation such as "upper", "lower", "distal", and "proximate" are merely used to help describe the location of components with respect to one another. For example, an "upper" surface of a part is merely meant to describe a surface that is separate from the "lower" surface of that same part. No words denoting orientation are used to describe an absolute orientation (i.e. where an "upper" part must always be on top).

Referring now to FIG. 1, a schematic block diagram of a plasma generation system with phase-locked solid-state RF generators (or microwave generators), according to some exemplary embodiments is shown generally at 100. The system 100 includes a primary power and control module 102 which generates an output 120a, 120b energy for a processing chamber 122. The primary power and control module 102 includes a number of solid-state generators 104a, 104b which are sub-modules of the primary power and control module 102. While the exemplary power and control module 102 includes two solid-state generators 104a, 104b, it should be understood that this is for ease of explanation only. In other cases, a number of additional solid-state generators 104c, 104d, 104e . . . 104n (generally 104) can be included in the control module 102 and can function in accordance with the teachings herein. For example, in some cases the power and control module 102 can include 10 solid-state generators 104. The generators 104 are phase linked and run off a shared clock signal to induce phase-locked loop (PLL) operation, as will be discussed in more detail herein. Each solid-state generator 104 includes an RF source module 106a, 106b and an RF load module 108a, 108b. The RF source module 106a, 106b controls the frequency, phase, and power of the individual solid state generator 104a, 104b. The RF load modules 108a, 108b measure the load impedance and effectively the phase and magnitude of the load impedance of each individual generator 104a, 104b.

An output 120a, 120b from each solid state generator 104a, 104b provides generator power to a respective input 112a, 112b which couples RF or microwave energy 128a, 128b to the processing chamber 122 via a waveguide 114a, 114b (or coaxial cable delivery components, or the like). The frequency, phase, and power of the RF or microwave energy 128a, 128b are the result of the coupling of the inputs 112a, 112b into the processing chamber via the waveguide 114a, 114b. The processing chamber 122, which can be a cavity, plasma tube, or the like, forms a reaction chamber. A processing substrate 124 (or semiconductor wafer or the like) within the reaction chamber 122 is pre-heated to a processing temperature on a heated chuck 126. A gas inlet 130 delivers processing gases into the processing chamber 122 as are needed for a particular plasma processing recipe.

The inputs 112a, 112b contain the frequency, phase, and power ($f_1$, $\varphi_1$, $P_1$ and $f_2$, $\varphi_2$, $P_2$) of the RF or microwave energy 128a, 128b. Therefore the RF load module 108a measures the load impedance (and effectively the phase and magnitude) between the output 120a and input 112a. Likewise, the RF load module 108b measures the load impedance between the output 120b and input 112b. Based on the measurements from the respective RF load modules 108a, 108b, RF source modules 104a, 104b can then manipulate the RF or microwave energy 128a, 128b, changing the frequency, phase, and power to provide spatial performance management within the processing chamber 122. It should be understood that the system 100 can also include processors, data, and other processing components as are necessary to carry out the functions of the system 100 described herein.

Figure 2:
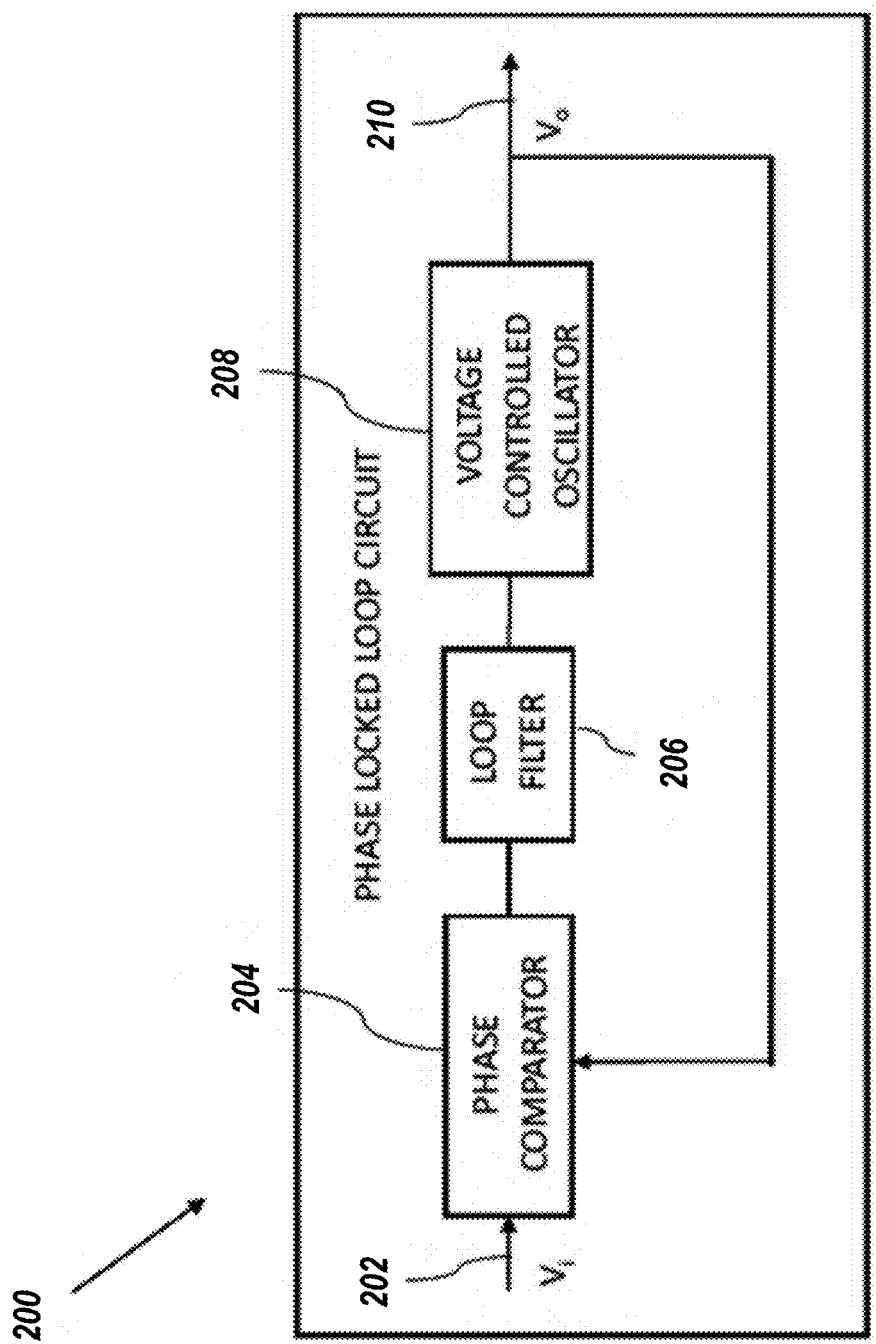
FIG. 2 is a functional block diagram of an exemplary phase locked loop (PLL) circuit that can be included as part of a plasma generation system in accordance with the subject technology.

As noted, the generators 104 of the system 100 are arranged in a PLL. Referring now to FIG. 2, a functional block diagram of an exemplary PLL is shown generally at 200. Notably, while various configurations of PLL may be implemented in a system of the subject disclosure, the PLL 200 is an example of one such system. The exemplary PLL 200 takes an input signal $V_i$ 202 and generates an output signal $V_O$ 210 with a related phase. The PLL 200 has a voltage controlled oscillator 208 which generates a periodic signal. A phase comparator 204 compares the phase of the periodic signal from the oscillator 208 with the phase of the input signal $V_i$ 202, adjusting the oscillator 208 to keep the phases matched. The PLL 200 also includes a loop filter 206, which can be a low pass filter or the like. The loop filter 206 generally acts to determine loop dynamics and limit the reference frequency energy applied to the input of the oscillator 208. Notably, matching input and output phases also requires keeping input and output frequencies the same. Therefore the PLL 200 can additionally track input frequency and match output frequency accordingly.

Figure 3B:
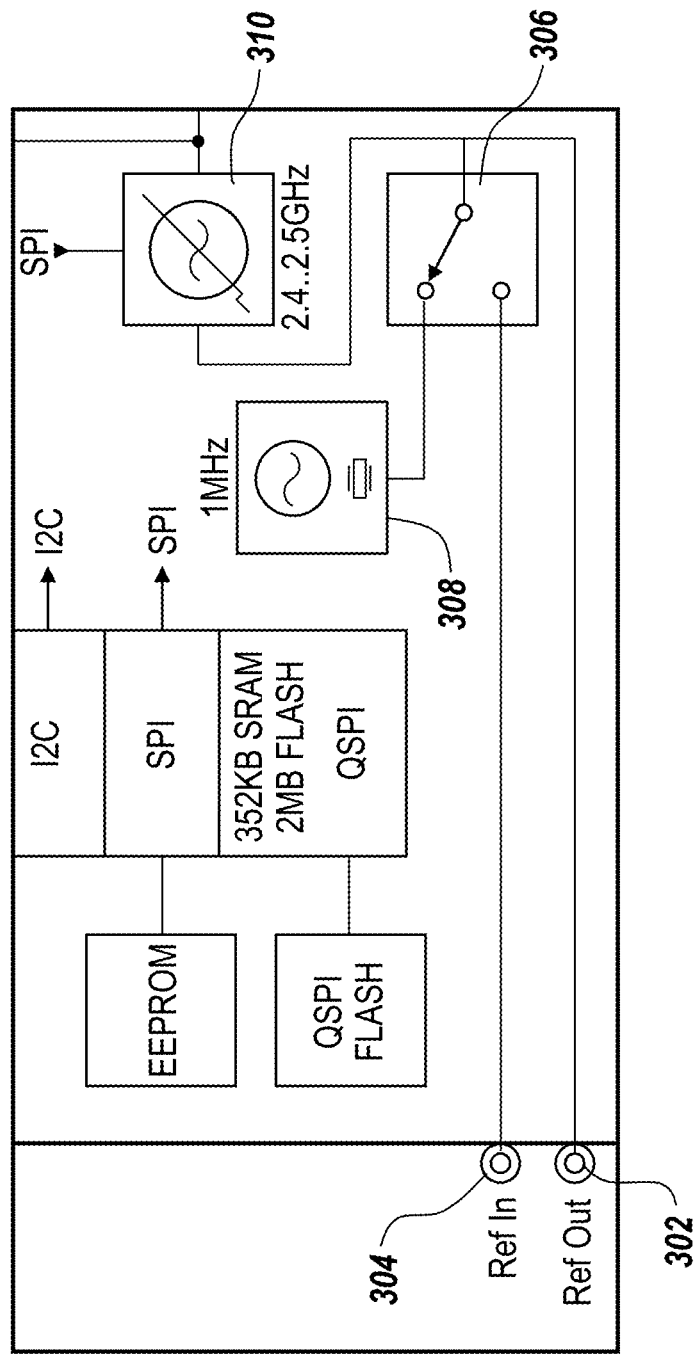
FIGS. 3B-3C are block diagrams of portions of the circuit of FIG. 3A.
Figure 3C:
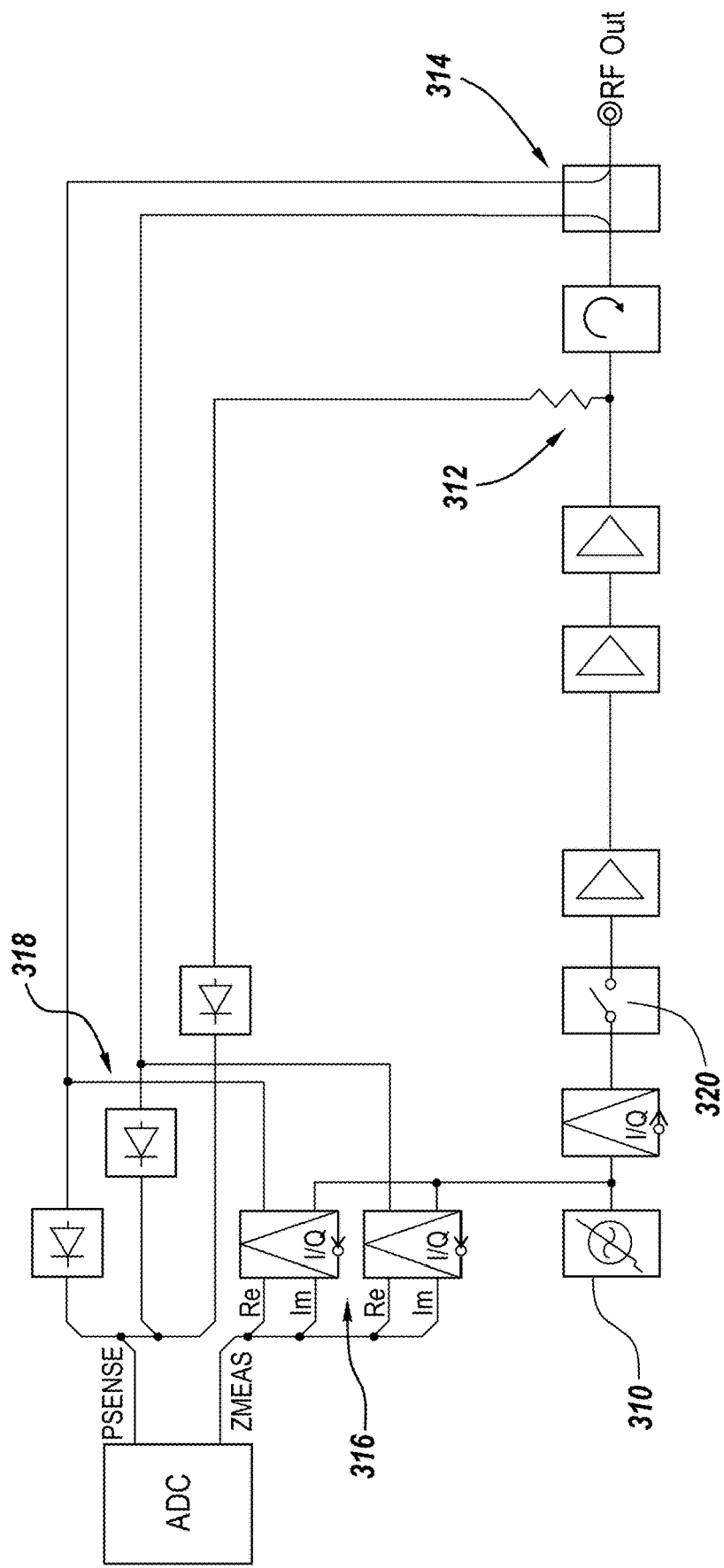

Referring now to FIGS. 3A-3C, the circuit configurations of an exemplary RF generator are shown generally at 300. In particular, FIG. 3A depicts the circuit 300 an RF generator. FIGS. 3B-3C each depict a portion of the circuit 300 of the RF generator. The RF generator can provide a 250 watt RF source, for example which functions as part of the microwave power generation system shown and described herein. Any of the RF generators arranged in a system in accordance with the teachings herein (e.g. RF generators 104a, 104b) can function in accordance with the exemplary circuit 300. It should be understood that the circuit 300 is shown and described to teach a possible electrical configuration of an RF generator within the system only. A higher or lower power RF source could be provided in other embodiments. Similarly, all components of the circuit 300 described herein are provided as one example of an effective circuit, it being understood that in other cases the circuit may be configured differently while still effectively functioning as part of the system shown and described herein.

As best seen in FIG. 3B, the circuit 300 includes a PLL reference input 304 ("Ref In"), a PLL reference output 302 ("Reference Out"), an electronic switch 306, a reference clock 308, and a synthesizer 310. The reference input 302 is connected to the electronic switch 306 which in turn is connected to the reference clock. The reference clock 308 omits a periodic signal, such as a 1 MHz clock signal. The reference output 302 is also connected to the switch 306 and to the synthesizer 310, which can be a 2.4-2.5 GHz synthesizer. The synthesizer 310 is connected to another electronic switch 320 which is used to pulse modulate the signal for the desired pulse rise and fall, and width times.

Figure 4:
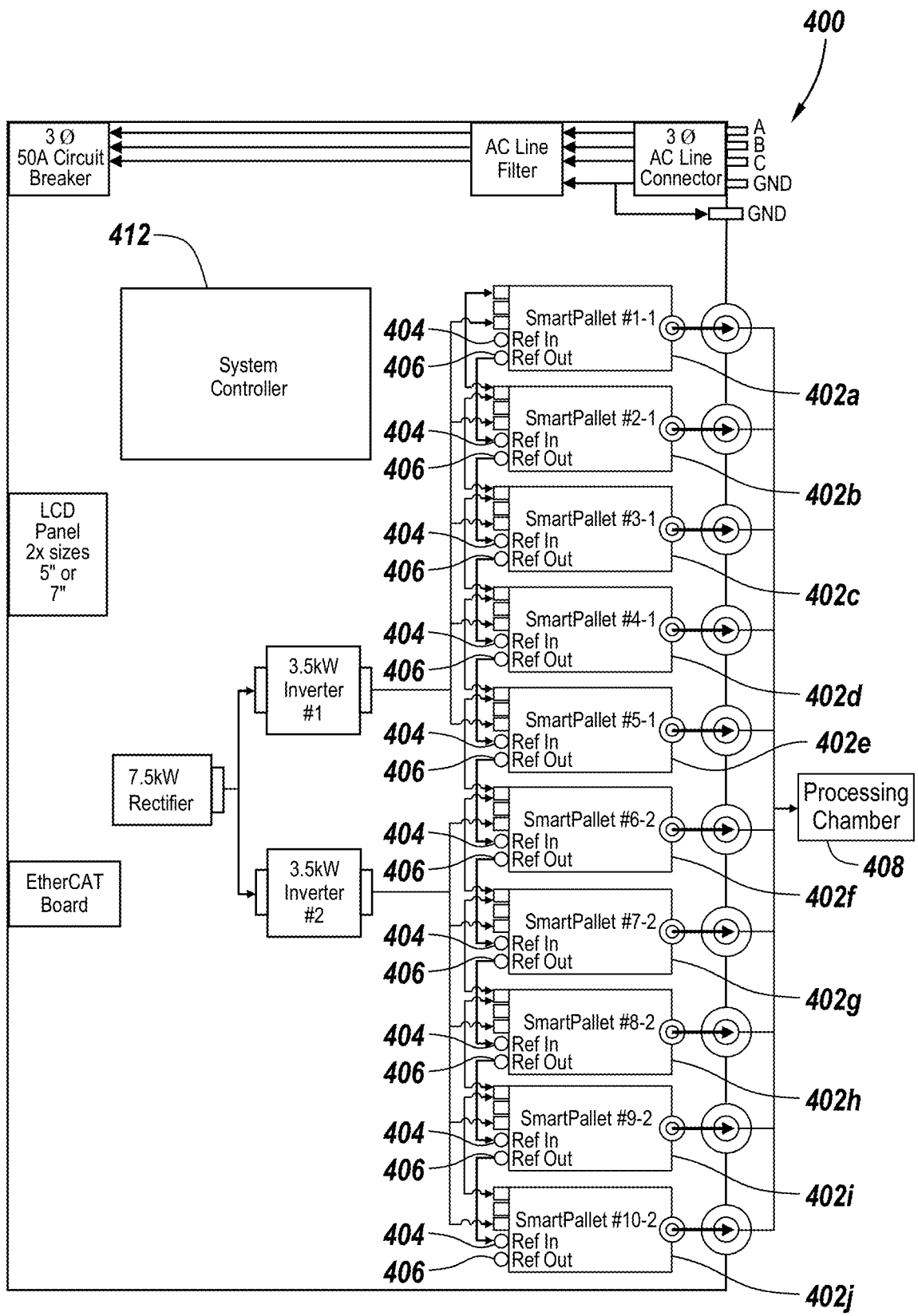
FIG. 4 is a schematic block diagram of another plasma generation system in accordance with the subject technology.

Referring now to FIG. 4, an exemplary microwave power generation system as part of a plasma generation system in accordance with the subject technology is shown generally at 400. The system 400 can function similarly to the system 100, and vice versa, except as otherwise shown and described herein. The microwave power generation system 400 includes 10 connected RF generators 402a-j (e.g. configured similarly to solid state generators 104a, 104b), although it should be understood that a different number of generators 402a-j (generally 402) could also be used. The RF generators 402 can be 250 watts in power, in some cases, although other power levels can be used as well. A system controller 412 includes a processor and memory to control operation of the power generator 400. The system controller 412 can execute programed instructions, such as algorithms or the like, to cause the system 400 to operate in accordance with the teachings herein. Further, the system controller 412 can include memory, including data banks as are described herein, for storing measured or input data. A combined power from the generators 402 is provided to a processing chamber 408.

Each RF generator 402 includes a respective reference input 404 and reference output 406, which can be configured similarly to the reference input 302 and reference output 304. In particular, the reference inputs 404 and outputs 406 are connected between RF generators 402 for PLL operation. The reference inputs 404 and outputs 406 connect each RF generator 402 to the same electronic switch 306 (see circuit 300 of FIGS. 3A-3C), connecting each RF generator 402 to the same reference clock 308 simultaneously such that they operate off the same periodic signal. Sharing the same clock 308 induces phase lock loop (PLL) operation between the RF generators 402, as described above. This allows phase linking of all RF generators 402, resulting in a sum power of combined RF generators 402 that is most efficient and has no loss of power.

Figure 7:
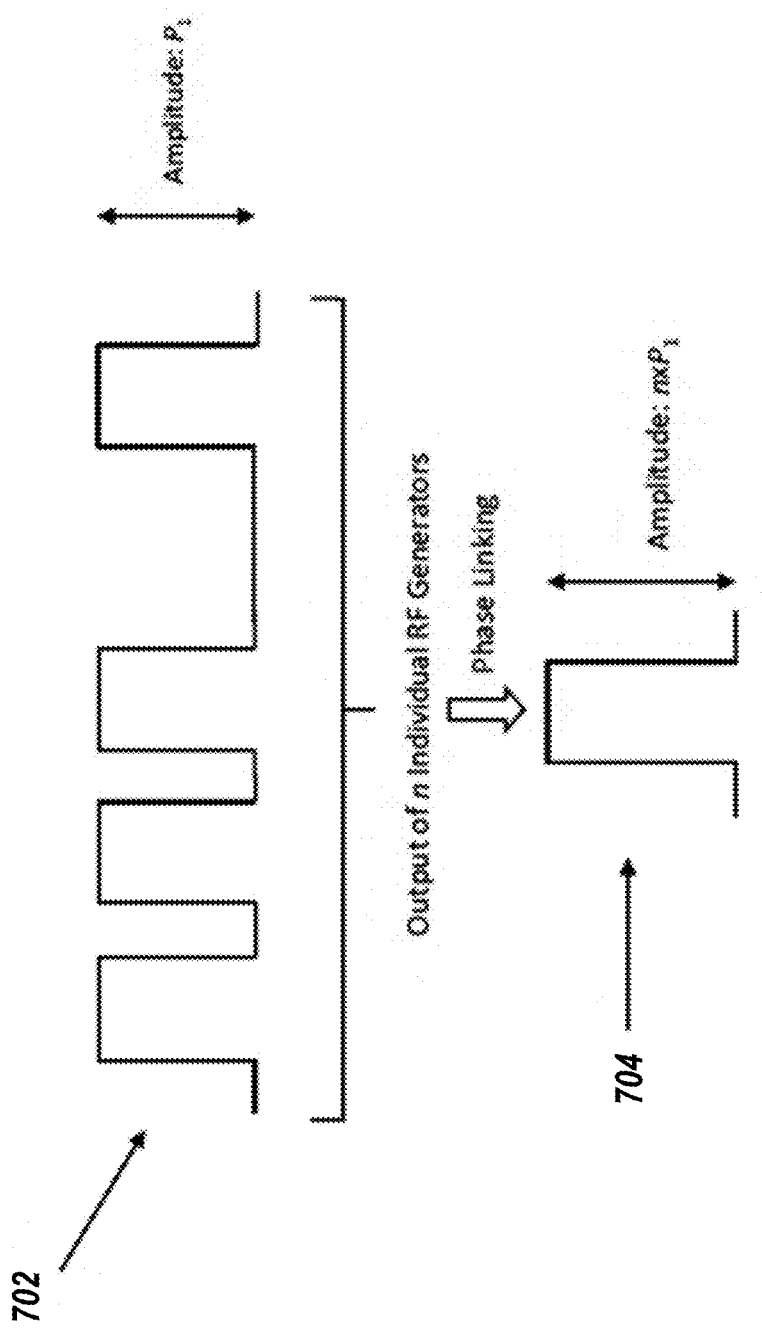
FIG. 7 is a graph comparing individual and combined power of power generators in accordance with the subject technology.

For example, referring now to FIG. 7, an exemplary graph of combined generator power is shown. The output of power from each individual generator 402 is shown in the upper plot 702. The combined power of all generators 402 is shown in the lower plot 704. Phase linking allows the output of generators 402 to be superimposed on top of each other with no overlapping. As such, each generator 402 outputs a power, individually, with amplitude $P_1$. Assuming "n" number of generators 402, the generators are phase linked and therefore their combined power is a multiple of "n" times $P_1$. This creates a maximum summation of all individual generators (amplitude "n×$P_1$") as shown in plot 704. This is similarly the case for the combination of the power of generators 104 of FIG. 1, which are also in a PLL arrangement. In contrast, the absence of phase linking results in inefficiencies as the individual RF generator powers are summed.

Referring again to FIGS. 3A-3C, and as best seen in FIG. 3C, the circuit 300 includes a forward power detector 312 a forward/reflected power detector 314 which can be used to measure impedance in real-time by monitoring multiple signals and analyzing the data through IQ modulators 316. An RF signal is applied to the inputs of RF transconductance amplifiers 318 and is then demodulated, by the IQ modulators 316, into I/Q baseband signals ("I" is referred to the "in-phase" component of the signal, while the "Q" represents the quadrature component) using quadrature LO signals. The quadrature LO signals are internally generated from an LO source (e.g. the synthesizer 310) by 90° phase-shifters.

Figure 5:
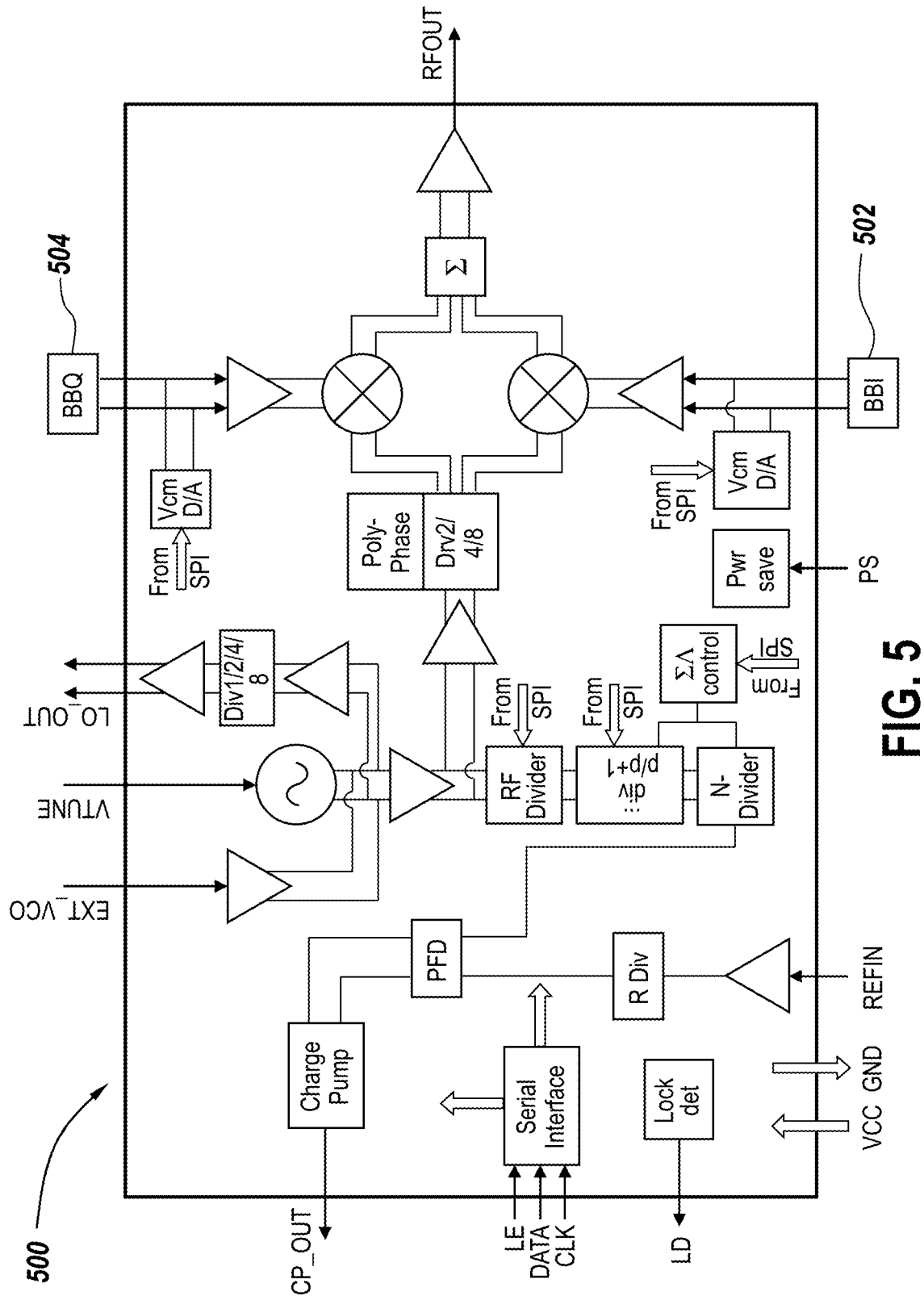
FIG. 5 is a schematic functional block diagram of the circuitry of an I/Q modulator as part of a system configured in accordance with the subject technology.

Referring now to FIG. 5, an exemplary schematic functional block diagram of the circuitry of an I/Q modulator 500 is shown. Other I/Q modulators described herein, such as I/Q modulator 316, can be configured in accordance with the I/Q modulator 500. In some particular exemplary embodiments, the design incorporates the Texas Instruments TRF372017 Integrated IQ Modulator PLL/VCO, or similar circuitry. The TRF372017 is a high-performance, high-linearity, low noise IQ modulator and an integer-fractional PLL/VCO. The "LO" is available as an output with independent frequency dividers, but can accept input from an external LO or VCO, which is the reference signal from the synthesizer 310 in the exemplary embodiments.

The BBi 502 is a set of differential signals relating to the positive and negative aspects of the in-phase component. The BBq 504 is a set of differential signals relating to the positive and negative aspects of the quadrature component. This refers to a pair of periodic signals that differ in phase by 90°. The in-phase and quadrature components refer to two sinusoids that have the same frequency and are 90° out of phase. By convention, the "I" signal is a cosine waveform and the "Q" signal is the sine waveform. Since a sine wave is shifted by 90° relative to a cosine wave, another way to express this is that the sine and cosine waves are "in quadrature."

Figure 6:
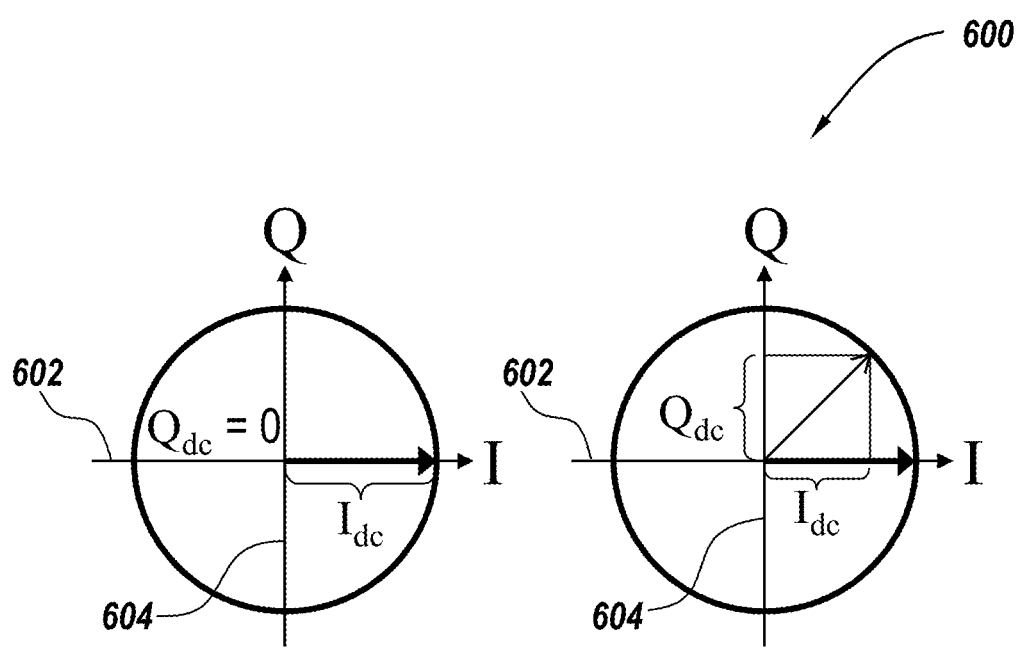
FIG. 6 shows exemplary polar plots of an I/Q signal.

Referring now to FIG. 6, exemplary polar plots of an I/Q signal (e.g. as part of the circuit 300) are shown generally at 600. When modulating a carrier with a waveform that changes the carrier's frequency slightly, the modulating signal can be treated as a phasor. As a phasor it has both a real and an imaginary part. The real component is related to the in-phase or "I" (horizontal axis 602), while the imaginary part is the quadrature or "Q" (vertical axis 604). With both the "I" and "Q" components of the modulating signal and a receiver that has locked to the carrier signal, the information can be illustrated on the polar plot 600. The RF signal, once plotted, can be represented in polar coordinates by magnitude and phase, or in x-y coordinates as magnitudes of x and y vectors. The quadrature signals are generated by the 90-deg. hybrid. The I/Q signal's magnitude and polarity determine the translated magnitude and phase of the I/Q vector (modulated RF carrier). Knowing the magnitude and phase, voltage standing wave ratio (VSWR) and complex reflection coefficient can be calculated.

Referring again to FIG. 4, by running multiple phase-linked generators 402 into a single cavity or plasma source, such as processing chamber 408, real-time impedance measurements can be performed at the entry of the input (e.g. antenna) into the processing chamber 408, and therefore VSWR can be determined. Knowing the VSWR and complex reflection coefficient, one can calculate the phase and magnitude of the microwave or RF energy in the processing chamber 408. The following are exemplary, but not exclusive, formulae for doing so:

$$\rho = V_{max}/V_{min} \quad \text{Eqn. 1}$$

$$\Gamma = (1-\rho)/(1+\rho) \quad \text{Eqn. 2}$$

$$\Gamma \angle° = V_{ref}/V_{fwd} \quad \text{Eqn. 3}$$

$$\Gamma = (Z_L - Z_0)/(Z_L + Z_0) \quad \text{Eqn. 4}$$

In the above equations, $Z_L$ and $Z_0$ are the load and characteristic load impedance, respectively. The variable $\rho$ is the voltage standing wave ratio (VSWR). $V_{max}$ is the voltage maximum defined in the VSWR maximum voltage, and $V_{min}$ is the voltage minimum defined in the VSWR minimum voltage for a typical radiated source. $\Gamma$ is the absolute value of the reflection coefficient, which is usually defined as $\Gamma \angle °$, where $\angle °$ is the defined phase associated with the complex reflection coefficient. $V_{ref}$ is the reflected voltage and $V_{fwd}$ is the forward or incident voltage.

Given the above, the system 400 calculates the spatial impedance associated with each generator 402. By knowing the spatial impedance of each generator 402, the system 400 can calculate the spatial impedance for all generators 402, thus giving the impedance of all associated inputs into the processing chamber 408. The system controller 412 can then adjust the inputs into the processing chamber 408 to manipulate and tune the inputs, as discussed in more detail herein. By using multiple entries into the chamber 408, and by adjusting the phase, magnitude, and frequency of each individual generator 402, the system 400 can manipulate the plasma at different locations in a spatial configuration and manner to create ideal uniform plasma in terms of both magnitude and density, mitigating shortcomings of conventional approaches discussed herein.

Similarly, and by way of another example, referring again to FIG. 1 where a substrate 124 (or semiconductor wafer) is positioned within a processing chamber 122, the system 100 is able to calculate the impedance of each RF generator output 120a, 120b or processing chamber input 112a, 112b.

The system 100 can then manipulate and tune the phase, magnitude, and frequency of all the inputs 112a, 112b using a computer and software-based algorithm, and plot the resulting output. Furthermore the phase, magnitude and frequency can be changed to tune for a uniform plasma performance resulting in a better process performance, faster throughput, and better and improved yield and less variations from substrate or wafer run to run. In this way by using multiple entries and by adjusting the phase, magnitude, and frequency of each individual RF or microwave input energy, one can manipulate the plasma at different locations in a spatial configuration and manner to create ideal uniform plasma in terms of both magnitude and density and also to mitigate the shortcomings of conventional approaches described herein.

By inducing uniform plasma, one can effectively improve the performance of semiconductor processing substrates. A uniform plasma can provide a faster performance since, in the presence of non-uniform plasma, the substrate undergoing a semiconductor processing (e.g. substrate 124) would be exposed to over-processing, such as over etching, over ashing, or over deposition, to cover the areas of the wafer that are exposed to lower plasma magnitude or intensity. By eliminating this over-processing as discussed herein, the throughput of the semiconductor processing is improved. Also, the uniform plasma generated according to the exemplary embodiments can provide a better yield because, usually, over-processing as described above (over etching, over ashing, and over deposition) would result in less than ideal yield since the over-processing may damage the under layers created by the prior process steps. Furthermore, variations from run to run can also be mitigated by utilizing uniform plasma. The uniform plasma will provide the same semiconductor performance throughout the substrate 124 on every single required step taken during the multitude of the steps needed to complete a finished substrate 124.

Further, deterioration of the processing chamber or the like (e.g. plasma tube or processing cavity) remains a concern in plasma generation systems and processes. In some cases, the system 100 can measure impedance, either continuously or in certain intervals of time, and store the change in impedance over time in a data bank, or the like. As the surface within the processing chamber becomes eroded, the impedance of the eroded surface can be compared to the stored impedance data within the system's data bank to determine that the surface has eroded. In this way, the life span of the processing cavity can be accurately monitored and appropriate action can be taken.

Figure 8A:
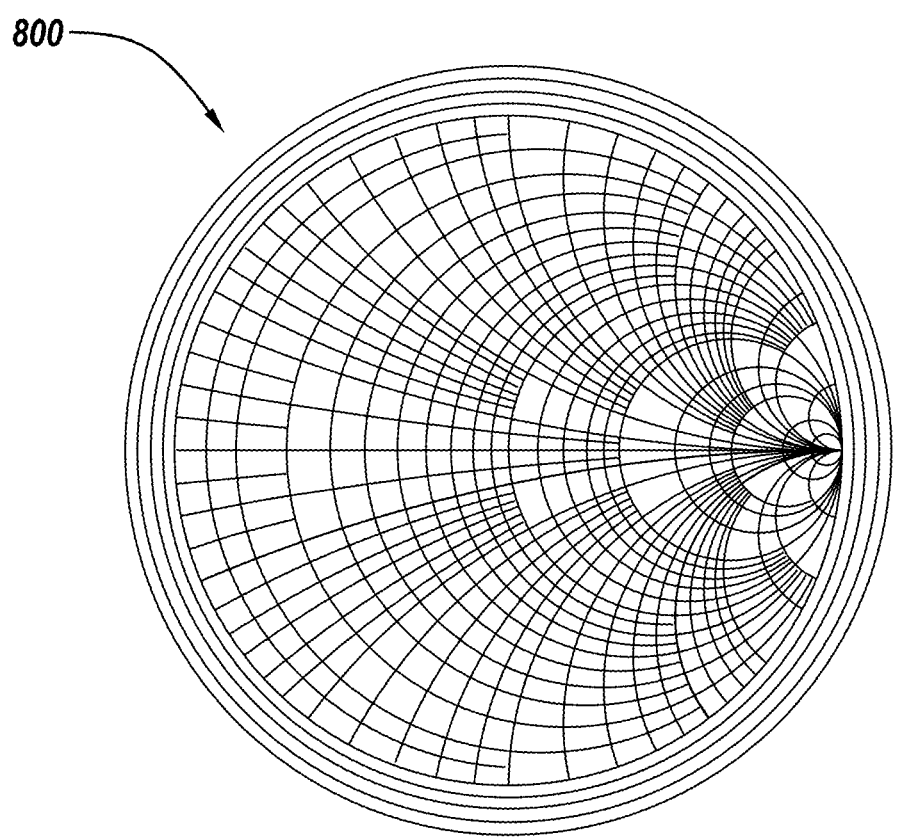
FIG. 8A is an exemplary Smith Chart.
Figure 8B:
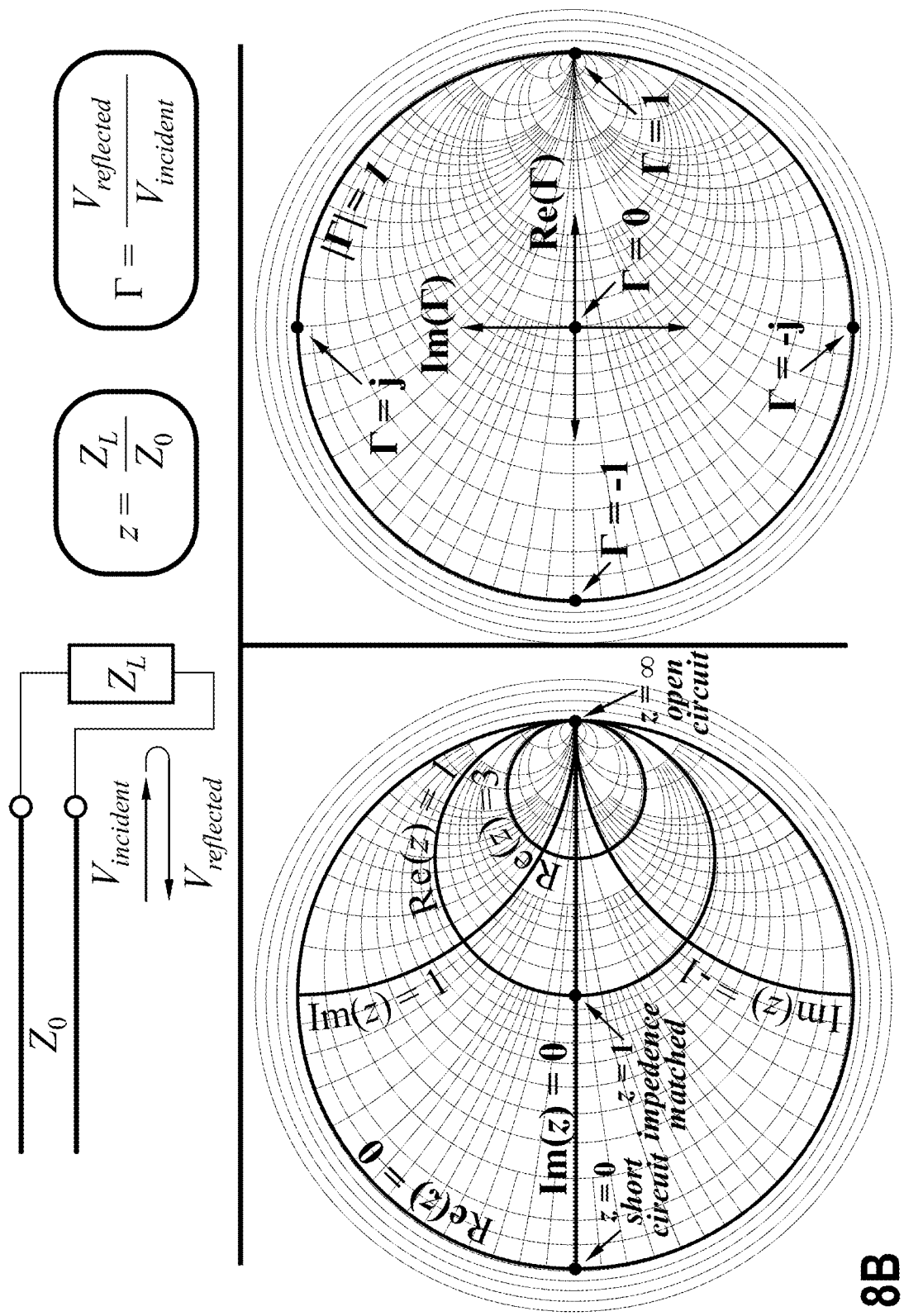
FIG. 8B shows exemplary Smith Charts with contours added for use within a system and process in accordance with the subject technology.

Referring now to FIGS. 8A, 8B, the systems described herein can be configured to employ the above technique to determine what process gases are being processed by knowing the impedance of the plasma to be either capacitive or inductive. FIG. 8A shows a Smith Chart 800, which is a circular microwave or RF impedance chart used to determine the characteristics of a microwave or RF power in a delivery system. FIG. 8B shows exemplary Smith Charts 802 that have been marked up to show how a Smith Chart is utilized within the system described herein. The Smith Charts 802 includes contours of VSWR (ρ), reflection coefficient (Γ), and phase (φ) of the energy, as one half could be designated as capacitive and the other half inductive. The system can then determine the nature of the process gasses by comparing the results to a look-up table. In some exemplary embodiments, this look-up table can include the characteristic impedance of all typical gasses used in the processing of a semiconductor substrate.

For example, the system (e.g. system 100, 400) can include a comprehensive data bank of all semiconductor processing gasses. In particular, the data bank can include the gasses which are most commonly used in plasma generation processes, such as $O_2$, $N_2$, $H_2$, Ar, fluorine-based gases, chlorine-based gases, and combinations of therefore. References to these gasses can be stored in the data bank along with their associated impedances, measured according to the present disclosure. Then, a measured impedance of an unknown gas can be compared to the data bank to determine the identity of the unknown gas. This process of identifying a processing gas can be advantageous. For example, if the impedance of a running plasma gas is recorded and reported back to a factory, it can then be determined what gasses the end-user is running in their semiconductor processing recipes.

This technique of monitoring the impedance of the processing chamber (e.g. processing chamber 122, 408) can also be used to determine a life time, or replacement time, of the processing chamber 122, 408 by monitoring the change of the impedance of the processing chamber 122, 408. In some cases, the system 100, 400 can measure the impedance and store the change in impedance over time, either continuously or in certain intervals of time, in a processor, data bank, or the like. The normal etching and degradation of the processing chamber 122, 408 will result in a change of the chamber impedance, and therefore an indication of the etching of the processing chamber 122, 408. The impedance of the eroded surface can be compared to the stored impedance data within the system's data bank to determine that the surface has eroded. In this way, the life span of the processing chamber 122, 408 can be accurately monitored and appropriate action can be taken. This is advantageous as the semiconductor fab user can be warned of the end life of the processing chamber 122, 408 by the system 100, 400. As the impedance of the plasma processing chamber 122, 408 changes due to the deterioration of the eroded plasma tube surface caused by the interaction of the plasma with the exposed surface, the system 100, 400 can generate one or more series of messages and display them to the user to apprise them of the current condition. Exemplary messages can include, "tube erosion is nearing maintenance time," "Warning: Tube Deteriorated for Replacement," and/or other warning or replacement messages or the like to advise the user of a status of the system 100, 400 and/or a possible recommended or required maintenance action. This is particularly beneficial in semiconductor processing, since the "uptime" in semiconductor processing is of the utmost importance. Therefore, letting the end-user know in advance of a potential maintenance activity can be extremely helpful from the standpoint of anticipating and planning for possible downtime.

Figure 9:
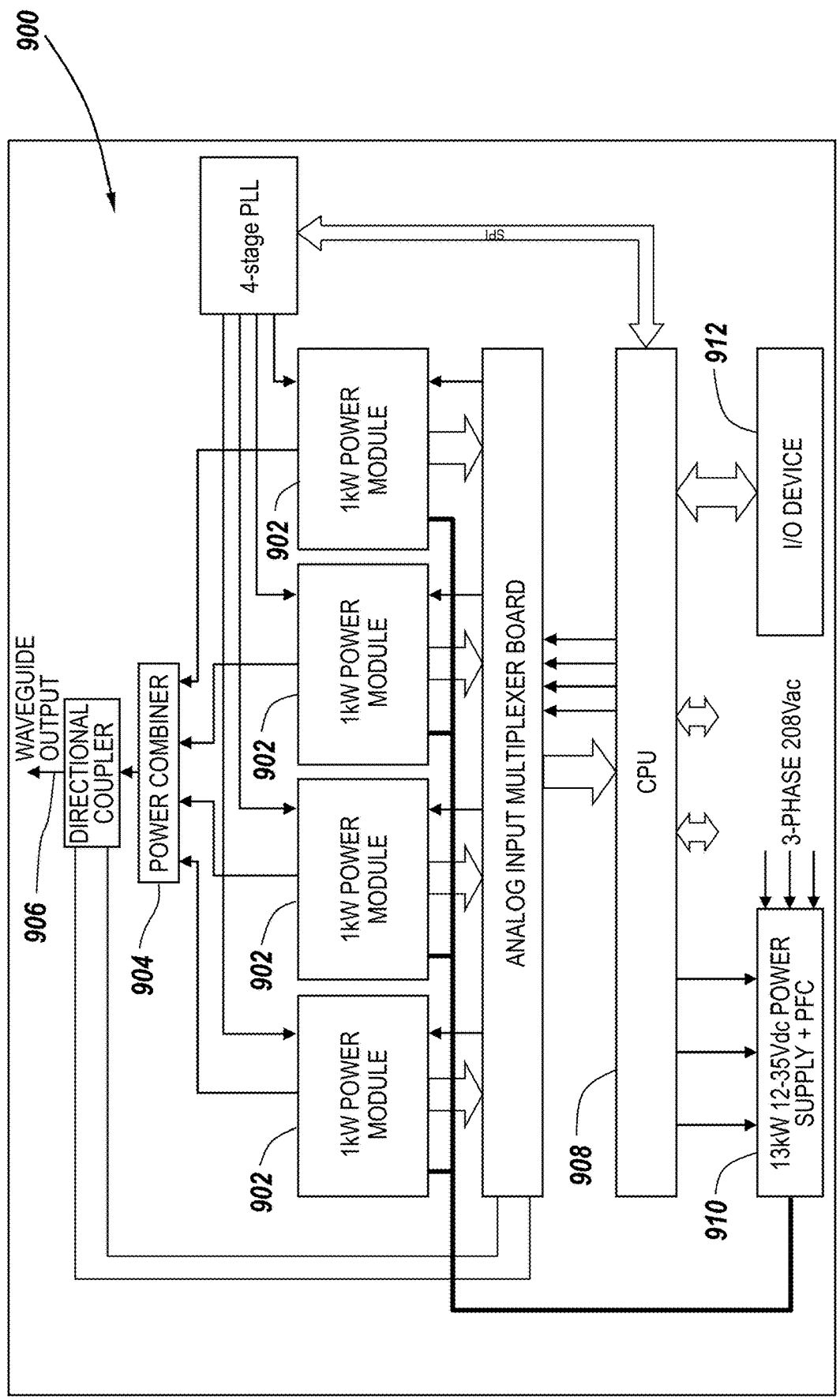
FIG. 9 is a schematic block diagram of an exemplary power generation system in accordance with the subject technology.

Referring now to FIG. 9, a block diagram of an exemplary power generation system 900 is shown. The system 900 can be configured to generate power similarly to the systems 100, 400 previously described, except as otherwise shown and described herein.

The system 900 includes a number of individual power generator modules 902a-d (generally 902) powered by a power source 910 and connected in a PLL. The system 900 employs high frequency daisy chaining to allow coherent excitation of multiple RF amplifier chains and, for example, 360 degree a phase shifter with 1.4 degree steps. It should be understood that while 4 separate 1 kw power generator modules are shown by way of example, different numbers of generator modules 902 could be used in other embodiments, as could generator modules of different powers. Unlike other systems 100, 400 described herein, the generator modules 902 need not be connected to a shared reference clock, other steps being taking to achieve phase optimization. The power from the generator modules 902 is combined in a power combiner 904 and optimized for a number of channels. The power can then be provided to a source (not shown herein) via a waveguide output 906. The source could be a processing chamber, as discussed above, for processing a semiconductor substrate, or for drying food or other applications.

The system 900 also includes a processing module 908 which can execute programed instructions, such as algorithms or the like, to cause the system 900 to operate in accordance with the teachings herein. The processing module 908 can also include memory, including data banks or the like, for storing measured or input data. The processor 908 is connected to an input/output (I/O) device 912. The I/O device 912 can include input devices, such as buttons, a keyboard, a mouse, or other input devices as are known, which allow a user to enter data, controls, settings, or make other changes to the system 900. The I/O device 912 also includes an output portion which can display information about the system 900 for the user. For example, the I/O device 912 can include output capabilities such as warning lights or a screen to show graphs, warnings, or other visual indicators.

In a conventional system, amplitude and phase variations from device non-uniformities or manufacturing tolerances can lead to imperfect summation of power between different power modules, creating a reduction in combining efficiency. By contrast, the system 900 is able to combine power within the combiner 904 to balance the phase and amplitude of various channels. In particular, the system 900 employs a method of optimizing the phase between channels of the system 900. The system 900 programs the amplitude and phase of each generator module 902 and measures the output power of the combiner 904, determining the optimal phase of each power generator module 902 to maximize output power while minimizing losses.

The system 900 can execute algorithms employing various optimization techniques to maximize output power. One such optimization technique includes carrying out a bisection method to phase align two channels. By plotting the output power of the system 900, it can be seen that the combined output power of the system 900 as a function of the phase angle, P(θ), is unimodal (i.e. it has only one minimum/one maximum). Therefore, in some cases, the bisection method can be applied to find an optimum. For example, the notation f(x) is used herein for P(θ). Given an interval for f(x), a minimum is bracketed when there is a triplet of points a<b<c, such that f(b) is less than both f(a) and f(c). In such a case, the function (nonsingular) has a minimum in the interval [a, c]. A bisection algorithm then chooses a new point x, either between a and b, or between b and c. For the present example, assume that a point x is selected between b and c. The function f(x) is then evaluated.

Figure 10B:
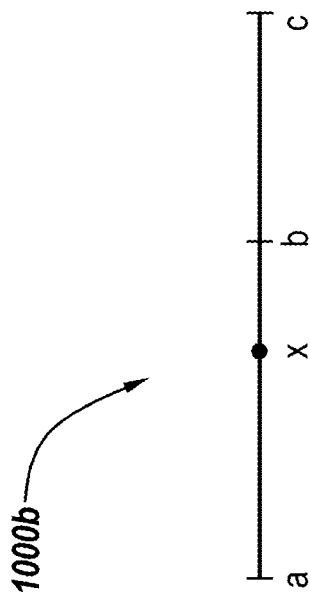
FIG. 10B is a graph showing another portion of a method of phase optimization in accordance with the subject technology.
Figure 10A:
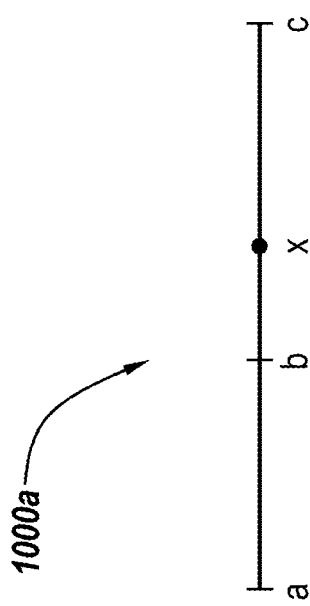
FIG. 10A is a graph showing a portion of a method of phase optimization in accordance with the subject technology.

If f(b)<f(x), then the new bracketing triplet of points is (a; b; x), as shown in graph 1000a of FIG. 10A. If f(b)>f(x), then the new bracketing triplet of points is (b; x;c), as shown in graph 1000b of FIG. 10B. In either case, the new triplet is the abscissa whose ordinate is the best minimum achieved so far. This process is repeated until the interval is sufficiently small, which can be based on the limit of the chip resolution of the system 900. Thus, a number of repetitions can be performed until the interval matches the chip resolution of the system 900.

The optimal bracketing interval (a; b; c) has it's middle point b a fractional distance 0.38197 from a and 0.61803 from b, as given by the following equations:

$$0.38197 \approx \frac{3 - \sqrt{5}}{2} \quad \text{Eqn. 5}$$

$$0.61803398 \approx \frac{\sqrt{5} - 1}{2} \quad \text{Eqn. 6}$$

The fractions of Equations 5 and 6 are the "golden mean" or "golden section." Thus, the next point to be used is a fraction 0.38197, which is placed into the larger of the two intervals (measuring from the central point of the triplet). Note that this method can be applied to find either the minimum or the maximum output power. Finding the minimum, in some cases, can be a more robust and faster approach as the gradient is much higher in proximity of the minimum. Furthermore, using the minimum allows amplitude optimization to be performed afterwards. The downside is that, in using the minimum, the system 900 is forced into the area of the worst configuration.

The amplitude of the combined output power of the system 900 as a function of the phase angle, P(θ), is also a periodic function. Trigonometric interpolation can therefore be used, which is to say, a finite sum of trigonometric functions can be used to interpolate the periodic function in accordance with either of the following equations:

$$f(x) = \frac{a_0}{2} + \sum_{k=1}^{M}(a_k\cos(kx) + b_k\sin(kx)) \quad \text{Eqn. 7}$$

$$P(x) = \sum_{k=-M}^{M} c_k e^{ikx} \quad \text{Eqn. 8}$$

In order to evaluate $a_k$ and $b_k$, a Goertzel-Reinsch algorithm or direct Discrete Fourier Transform algorithm can be used. In the present example, only the first coefficients $a_1$ and $b_1$ are of interest so more complete Fourier series analysis would only add complexity while yielding no additional advantages. In some cases, this method can be more robust and faster than the bisection method previously discussed. However, this method requires values in all the phase ranges, including phase values in the area of worst-case configuration.

The above exemplary methods are used to describe optimization when two amplifiers (e.g. two generator modules 902) are driving the combiner 904. When two generator modules 902 drive the combiner 904 and four channels are being combined in the combiner 904 output, optimization can be carried out by first turning on channels 1 and 2. Optimization is performed of channel 2 to match with channel 1, in accordance with the algorithms described above. Channel 2 is then turned off and channel 3 is turned on. Optimization of channel 3 is performed to match channel 1 in accordance with the algorithms described above. Channel 3 is then turned off and channel 4 is turned on. Optimization of channel 4 is performed to match channel 1 in accordance with the algorithms described above. All channels have then been optimized to match channel 1, and therefore an overall phase match has been achieved.

When additional generator modules 902 are used, channel optimization can be done one channel at a time and then repeated as necessary. Assuming 4 channels, channel 1 can be kept constant (periodicity 0). Channel 2 can then be rotated with the periodicity of channel 1. Channel 3 can then be rotated with the periodicity of channel 2. Channel 4 can then be rotated with the periodicity of channel 3. This allows for simultaneous outputs of different frequency out of the combiner 904.

For example, optimization of four channels when four power generator modules 902 are driving the combiner 904 can be done as follows. First, all channels are turned on. Then, optimization is performed of channel 2 to match the sum of other channels with one of the algorithms as described above. This matches channel 2 to the original sums of channels 1, 3, and 4. Optimization of channel 3 can then be performed to match the sum of other channels with one of the algorithms described above, matching channel 3 to the sum of channels 1 and 4 plus the improvement of channel 2. Then, optimization of channel 4 can be performed to match the sum of the other channels with one of the algorithms described above, including the improvement of channels 2 and 3. These steps of optimizing channels 2-4 can then be repeated until the match is satisfactory for the desired accuracy of the overall system 900.

All orientations and arrangements of the components shown herein are used by way of example only. Further, it will be appreciated by those of ordinary skill in the pertinent art that the functions of several elements may, in alternative embodiments, be carried out by fewer elements or a single element. Similarly, in some embodiments, any functional element may perform fewer, or different, operations than those described with respect to the illustrated embodiment. Also, functional elements shown as distinct for purposes of illustration may be incorporated within other functional elements in a particular implementation.

While the subject technology has been described with respect to preferred embodiments, those skilled in the art will readily appreciate that various changes and/or modifications can be made to the subject technology without departing from the spirit or scope of the subject technology. For example, each claim may depend from any or all claims in a multiple dependent manner even though such has not been originally claimed.

What is claimed is:

1. A method of generating power with a power generation system comprising:
    generating a plurality of outputs with a plurality of solid state generator modules; and
    combining, in a combiner, the outputs of the solid state generator modules from a plurality of channels using a phase optimization technique to generate an in phase combined output power,
        wherein the solid state generator modules are connected in a phase lock loop (PLL) such that the outputs of the solid state generator modules have a shared phase.

2. The method of claim 1, wherein the phase optimization technique includes:
    determining a phase shift for at least one of the channels; and
    phase shifting the at least one channel.

3. The method of claim 1, wherein the plurality of channels comprises three channels and the phase optimization technique includes:
    turning on the channels;
    determining a first channel, a second channel, and a third channel;
    phase shifting the second channel based on a sum of the first channel and the third channel to create an optimized second channel; and
    phase shifting the third channel based on a sum of the first channel and the optimized second channel.

4. The method of claim 3, further comprising at least one additional channel, wherein the phase optimization technique includes, for each additional channel, phase shifting said additional channel to create an optimized additional channel based on a sum of all other channels, including any optimized channels.

5. The method of claim 3, wherein the steps of phase shifting the second channel, phase shifting the third channel, and phase shifting additional channels are repeated a plurality of times.

6. The method of claim 1, wherein the phase optimization technique includes determining a phase shift for at least one of the channels using an algorithm, the algorithm comprising at least one of the following: a bisection method; a Goertzel-Reinsch algorithm; or a Discrete Fourier Transform.

7. The method of claim 6, wherein the plurality of channels comprises three channels and the phase optimization technique includes:
    determining a first channel, a second channel, and a third channel;
    turning on the first channel and the second channel;
    phase shifting the second channel to match an output of the first channel;
    turning off the second channel and turning on the third channel; and
    phase shifting the third channel to match the output of the first channel.

8. The method of claim 7, further comprising at least one additional channel, wherein, the phase optimization technique includes:
    for each additional channel, turning on the first channel and said additional channel, all other channels being turned off, and phase shifting said additional channel to match the output of the first channel.

9. The method of claim 1, further comprising providing the in phase combined output power to a waveguide output.

10. A power generation system comprising:
    a plurality of solid state generator modules configured to generate a plurality of outputs; and
    a combiner configured to combine the outputs of the solid state generator modules from a plurality of channels using a phase optimization technique to generate an in phase combined output power,
    wherein the solid state generator modules are connected in a phase lock loop (PLL) such that the outputs of the solid state generator modules have a shared phase.

11. The power generation system of claim 10, wherein the phase optimization technique includes:
    determining a phase shift for at least one of the channels; and
    phase shifting the at least one channel.

12. The power generation system of claim 10, wherein:
    the plurality of channels comprises three channels; and
    the phase optimization technique includes:
        turning on the channels;
        determining a first channel, a second channel, and a third channel;
        phase shifting the second channel based on a sum of the first channel and the third channel to create an optimized second channel; and phase shifting the third channel based on a sum of the first channel and the optimized second channel.

13. The power generation system of claim 12, further comprising at least one additional channel, wherein the phase optimization technique includes, for each additional channel, phase shifting said additional channel to create an optimized additional channel based on a sum of all other channels, including any optimized channels.

14. The power generation system of claim 12, wherein the system is configured to repeat the steps of phase shifting the second channel, phase shifting the third channel, and phase shifting additional channels a plurality of times.

15. The power generation system of claim 10, wherein the phase optimization technique includes determining a phase shift for at least one of the channels using an algorithm, the algorithm comprising at least one of the following: a bisection method; a Goertzel-Reinsch algorithm; or a Discrete Fourier Transform.

16. The power generation system of claim 15, wherein the plurality of channels comprises three channels and the phase optimization technique includes:
    determining a first channel, a second channel, and a third channel;
    turning on the first channel and the second channel;
    phase shifting the second channel to match an output of the first channel;
    turning off the second channel and turning on the third channel; and
    phase shifting the third channel to match the output of the first channel.

17. The power generation system of claim 16, further comprising at least one additional channel, wherein, the phase optimization technique includes:
    for each additional channel, turning on the first channel and said additional channel, all other channels being turned off, and phase shifting said additional channel to match the output of the first channel.

18. The power generation system of claim 10, further comprising a waveguide output, wherein the system is configured to provide the in phase combined output power to the waveguide output.

19. A method of generating power with a power generation system comprising:
    generating a plurality of outputs with a plurality of solid state generator modules; and
    combining, in a combiner, the outputs of the solid state generator modules from a plurality of channels using a phase optimization technique to generate an in phase combined output power, wherein the plurality of channels comprises three channels and the phase optimization technique includes:
    turning on the channels;
    determining a first channel, a second channel, and a third channel;
    phase shifting the second channel based on a sum of the first channel and the third channel to create an optimized second channel; and
    phase shifting the third channel based on a sum of the first channel and the optimized second channel.

* * * * *